(12) United States Patent
Ayel et al.

(10) Patent No.: US 12,382,196 B2
(45) Date of Patent: Aug. 5, 2025

(54) DEVICE FOR DETECTING OVERFLOW OF CHARGES FOR BACKSIDE ILLUMINATION PIXEL

(71) Applicant: COMMISSARIAT A L'ENERGIE ATOMIQUE ET AUX ENERGIES ALTERNATIVES, Paris (FR)

(72) Inventors: François Ayel, Grenoble (FR); Olivier Saxod, Grenoble (FR)

(73) Assignee: COMMISSARIAT A L'ENERGIE ATOMIQUE ET AUX ENERGIES ALTERNATIVES, Paris (FR)

(*) Notice: Subject to any disclaimer, the term of this patent is extended or adjusted under 35 U.S.C. 154(b) by 80 days.

(21) Appl. No.: 18/449,966

(22) Filed: Aug. 15, 2023

(65) Prior Publication Data

US 2024/0064426 A1  Feb. 22, 2024

(30) Foreign Application Priority Data

Aug. 17, 2022 (FR) ..................... 22 08346

(51) Int. Cl.
*H04N 25/707* (2023.01)
*G01S 7/481* (2006.01)
(Continued)

(52) U.S. Cl.
CPC ......... *H04N 25/707* (2023.01); *G01S 7/4816* (2013.01); *G01S 17/894* (2020.01); *H04N 25/47* (2023.01); *H04N 25/77* (2023.01)

(58) Field of Classification Search
CPC ..... G01S 17/894; G01S 7/4816; H04N 25/47; H04N 25/707; H04N 25/77; H04N 25/59; H04N 25/79; H10F 39/199; H10F 39/80373; H10F 39/80377; H10F 39/807; H10F 39/8033; H10D 1/665; H10D 8/605
See application file for complete search history.

(56) References Cited

U.S. PATENT DOCUMENTS 9,356,067 B2    5/2016  Shin
10,971,533 B2 * 4/2021  Roy ................ H04N 25/76
(Continued)

OTHER PUBLICATIONS

"A low-noise, P-type, vertically-pinned and back-side-illuminated pixel structure for image sensor applications"—B. Mamdy et al., International Image Sensor Society; IISW 2015 workshop—http//doi.org/10.60928/xngw-43rg (Year: 2015).*

(Continued)

*Primary Examiner* — Marly S Camargo
(74) *Attorney, Agent, or Firm* — Oblon, McClelland, Maier & Neustadt, L.L.P.

(57) ABSTRACT

An image sensor provided with a pixel including a photosensitive region formed in a semiconductor substrate and surrounded by a peripheral isolation trench; a sense node formed on a charge collecting region; a charge transfer gate around the sense node; a well; the pixel being provided with a so-called "detection acceleration" transistor configured to, during a so-called "charge overflow detection" operation, be switched on so as to weaken a potential barrier generated by the transfer gate and thus to favour an overflow of photo-generated charges to the sense node of the photosensitive region and to accelerate detection of this overflow.

14 Claims, 5 Drawing Sheets

(51) Int. Cl.
*G01S 17/894* (2020.01)
*H04N 25/47* (2023.01)
*H04N 25/77* (2023.01)

(56) References Cited

U.S. PATENT DOCUMENTS

| | | | |
|---|---|---|---|
| 2014/0284664 A1* | 9/2014 | Shin | H10F 39/8027 |
| | | | 257/225 |
| 2019/0019820 A1* | 1/2019 | Takizawa | H10F 39/802 |
| 2019/0237499 A1 | 8/2019 | Roy | |
| 2023/0254602 A1* | 8/2023 | Asatsuma | H10F 39/8027 |

OTHER PUBLICATIONS

French Preliminary Search Report issued Mar. 6, 2023 in French Application 22 08346 filed on Aug. 17, 2022, 2 pages (with English Translation of Categories of Cited Documents).

\* cited by examiner

DEVICE FOR DETECTING OVERFLOW OF CHARGES FOR BACKSIDE ILLUMINATION PIXEL

TECHNICAL FIELD

The present application relates to the field of image sensors, in particular the field of sensors provided with pixels with backside illumination, and more precisely those with clamped photodiodes provided with a charge-transfer gate structure.

PRIOR ART

An image sensor typically comprises a plurality of pixels, each provided with a photosensitive region formed in a substrate.

In an image sensor with backside illumination or BSI, there is a photoconversion or integration phase during which the back side of the substrate is illuminated and electron-hole pairs are generated and carriers, either photogenerated electrons or photogenerated holes, accumulate in the photosensitive region.

An example of a pixel with backside illumination is presented for example in the document US 2018/061875A1.

In this example, the substrate is placed in a depletion regime comparable to a clamped photodiode. The clamping is implemented by the inversion layer of biased capacitive deep isolation trenches (CDTI—"capacitive deep trench isolation").

In a reading phase, a charge transfer device is controlled so as to transfer the photogenerated charges that have accumulated in the photosensitive region to a doped charge-collecting semiconductor region connected to a detection node ("sense node").

In sensors comprising pixels intended to receive illumination by the back side of the substrate, for each pixel the charge-collecting region and the sense node are disposed at the front face of the substrate.

A vertical transfer gate can be provided to make it possible to control the transfer of charges contained in the photosensitive region to the collecting region and the reading node. This gate is typically disposed around the collecting region.

Applying a suitable potential to the transfer gate makes it possible to form a potential barrier in a region located inside the vertical transfer gate, between the photosensitive region and the collecting region. The presence of this potential barrier makes it possible, during an exposure phase, to block a transfer of photogenerated carriers from the photosensitive region to the collecting region. This potential barrier results from the presence, along the side walls of a trench in which the transfer gate is formed, of an inversion layer attracting the carriers of a type opposite to the substrate.

When there is illumination, the diode fills with charges. If the internal potential of the diode, which changes according to the quantity of charges accumulated, is higher than the potential of the barrier of a portion delimited and surrounded by the transfer gate or gates, charges will move towards the sense node.

There is a need to be able to detect this phenomenon, which can be termed "overflow" of charges, and in particular to be able to detect it quickly.

DESCRIPTION OF THE INVENTION

According to one aspect, the invention relates to an image sensor comprising one or more pixels, each pixel including:

- a photosensitive region formed in a semiconductor substrate;
- a peripheral isolation trench extending vertically in the semiconductor substrate and laterally delimiting the photosensitive region;
- a sense node including a region for collecting photogenerated charges arranged at a top face of the substrate, the charge-collecting region being doped and having a first conductivity type, in particular p type;
- a charge-transfer gate extending vertically in the semiconductor substrate around the charge-collecting region;
- a well interposed between the peripheral isolation trench and the vertical transfer gate, and arranged around the sense node, the well being doped and having a second conductivity type, opposite to the first conductivity type, in particular n type, the photosensitive region being formed by a first doped region that is of the first conductivity type, in particular p type, and which extends under the charge-collecting region and under the well and forms a diode with the well, the sensor being provided with a circuit for detecting overflow of charges configured to detect, during an operation of "charge-overflow detection" during which a biasing of the transfer gate is applied so as to form a potential barrier then maintained and following an illumination of the photosensitive region during the operation causing a transfer of photogenerated charges from the photosensitive region to the sense node and a variation in potential at this sense node, this variation in potential.

According to one embodiment, the invention relates to an image sensor comprising one or more pixels, each pixel including:

- a photosensitive region formed in a semiconductor substrate;
- a peripheral isolation trench extending vertically in the semiconductor substrate and laterally delimiting the photosensitive region;
- a sense node including a region for collecting photogenerated charges arranged at a top face of the substrate, the charge-collecting region being doped and having a first conductivity type, in particular p type;
- a charge-transfer gate extending vertically in the semiconductor substrate around the charge-collecting region;
- a well interposed between the peripheral isolation trench and the vertical transfer gate, and arranged around the sense node, the well being doped and having a second conductivity type, opposite to the first conductivity type, in particular n type, the photosensitive region being formed by a first doped region that is of the first conductivity type, in particular p type, and which extends under the charge-collecting region and under the well and forms a diode with the well, the sensor being provided with at least one pixel integrating a "detection acceleration" transistor, this transistor having a gate arranged on the top face of the substrate and which is connected to the sense node.

The "detection acceleration" transistor can be configured to be, during an operation of "charge-overflow detection" during which a potential barrier is maintained by biasing the transfer gate and following an illumination of the photosensitive region during the operation causing a transfer of photogenerated charges from the photosensitive region to the sense node and a variation in potential at this sense node, switched on, the switched-on "detection acceleration" transistor weakening the potential barrier and favouring a transfer of photogenerated charges to the sense node of the photosensitive region.

The transistor makes it possible to detect an overflow as quickly as possible while limiting the size of the pixel.

The pixel integrating the aforementioned transistor makes it possible to accelerate and amplify the detection of the overflow by causing a runaway at the diode. This makes it possible to relax the constraints in terms of gain of a detection stage connected to the sense node.

Apart from this detection stage, a conventional reading circuit can also be associated with the pixel for reading the residual charges.

The "detection acceleration" transistor may be an n-type transistor, in particular when the first region and the collecting region are p-doped regions.

Advantageously, the "detection acceleration" transistor includes a channel region formed in a doped part of the substrate having the first conductivity type, in particular p type.

According to one possibility of implementation, the channel region of the "detection acceleration" transistor extends at a top face of the semiconductor substrate between a well region forming a source region of the "detection acceleration" transistor, and another region having the second conductivity type, and forming a drain region of the "detection acceleration" transistor.

According to one possibility of implementation, the other region forming the drain region of the transistor has the second conductivity type and a doping, in particular of the n+ type, greater than the doping of said region of said well.

Advantageously, an isolation block is arranged between the peripheral isolation trench and the other region having the second conductivity type and forming the drain region of the transistor.

According to one possibility of implementation, the sensor can be provided with a control circuit configured to apply, during the operation of detecting overflow charges, a potential to the transfer gate during said operation of detecting overflow of charges.

According to one possibility of implementation the control circuit is configured to, during the operation of detecting overflow of charges:
  in a first phase, apply, to the gate of the "detection acceleration" transistor, a first initialisation potential so as to keep the transistor switched off, then
  in a second phase, put the sense node and the gate of the "detection acceleration" transistor in high impedance.

The control circuit may furthermore be configured to:
  in the first phase: apply, to a source region of the "detection acceleration" transistor, a second initialisation potential preferably lower than a given potential applied to a drain region of the "detection acceleration" transistor, then
  in said second phase: put the region of the well forming the source region of the "detection acceleration" transistor in high impedance while maintaining the given potential on the other region forming the drain region.

The control circuit can be configured to, following the variation in potential on the sense node, reset the sense node to the first initialisation potential and the region of said well to the second initialisation potential.

According to one possibility of implementation the control circuit can be provided with:
  a first stage, in particular provided with at least one gate implementing a "NOR" logic function, comprising a first input designed to receive a signal triggering the start of a detection operation and a second input coupled to the sense node and to the "detection acceleration" transistor gate,
  a first coupling switch controlled by the output signal of the first stage and which is designed to, when it is switched on, couple the sense node to a first initialisation potential and, when it is switched off, set the sense node to high impedance,
  a second coupling switch controlled by an output signal of the first stage and which is designed to, when it is switched on, couple the well to a second initialisation potential and, when it is switched off, to set the well to high impedance.

The "detection acceleration" transistor can belong to a circuit indicating charge overflow formed by an indicator stage, in particular provided with a comparator or with a logic gate, such as a logic gate fulfilling a "YES" function or a "NO" function, configured to, following the variation in potential on the sense node, produce an overflow indicator signal.

Advantageously, the overflow indicator circuit can be associated with a counter configured to be incremented at each reception of said overflow indicator signal.

According to a particular implementation of the sensor, the pixels are arranged in a given level $N_1$ of a device including a plurality of superimposed levels of components and wherein the control circuit is arranged in another level $N_2$ of the device, distinct from said given level, said given level and said other level being superimposed.

According to another aspect, the present invention relates to a time-of-flight image capture device comprising an image sensor as defined above.

According to another aspect, the present invention relates to an image capture device based on the detection of events comprising an image sensor as defined above.

BRIEF DESCRIPTION OF THE DRAWINGS

The present invention will be better understood in light of the following description and the appended drawings wherein.

Identical, similar or equivalent parts of the various figures bear the same numerical references so as to facilitate the transition from one figure to the other.

The various parts shown in the figures are not necessarily according to a uniform scale, in order to make the figures more readable.

DETAILED DISCLOSURE OF PARTICULAR EMBODIMENTS

Figure 1:
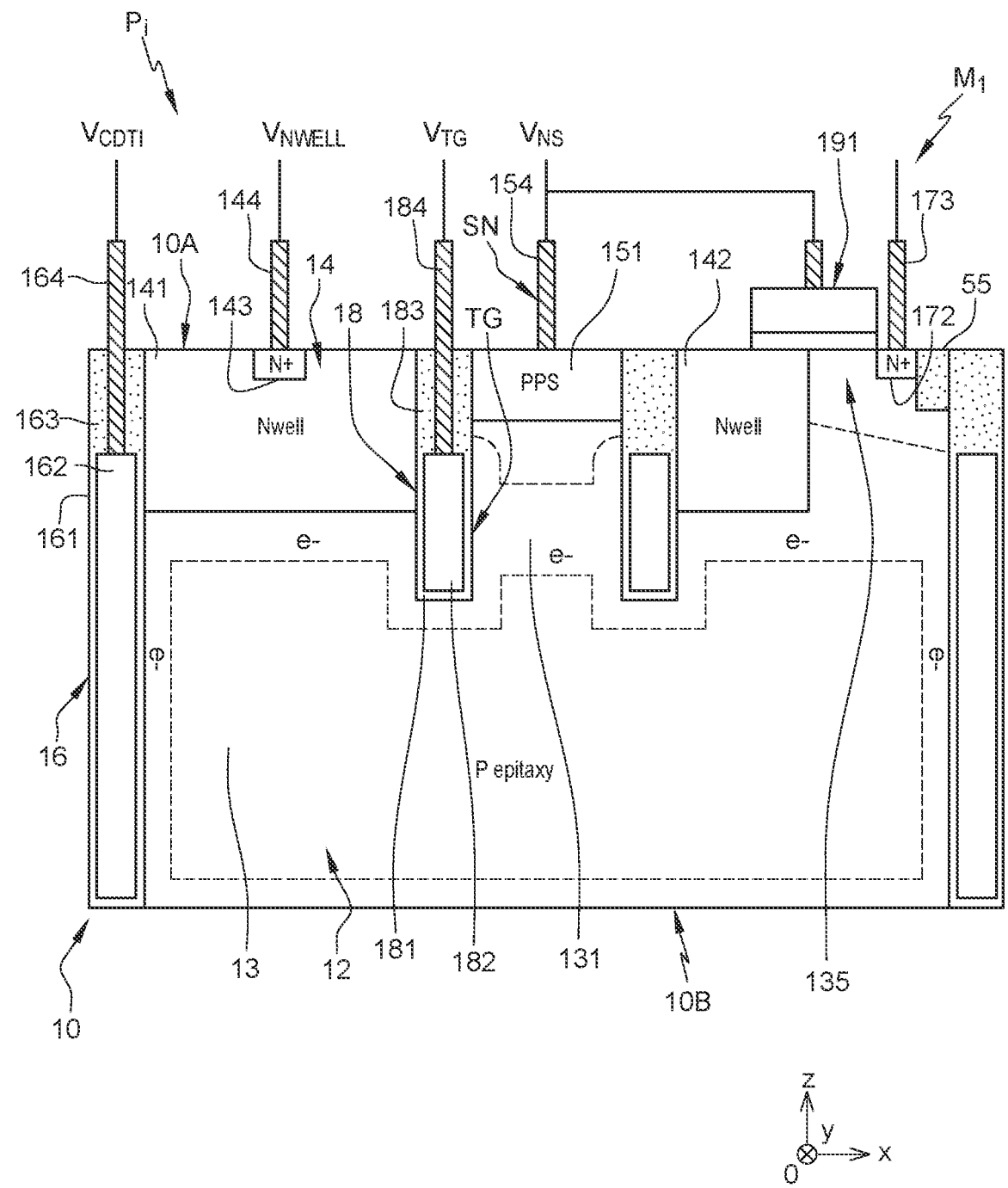
FIG. 1 is a schematic partial view in cross section of an image capture pixel associated with a transistor for accelerating detection of an overflow of charges to the sense node.

Reference is now made to FIG. 1 giving, schematically and partially and in a view in cross section, an arrangement of a pixel Pi with improved speed of detection of charge overflow or of exceeding of charge threshold.

The pixel Pi belongs to an image typically provided with a plurality of pixels identical to the pixel Pi and in particular arranged in a matrix. In the example shown, the pixel Pi includes a photosensitive region 12 intended to collect photons, during phases of exposure of the image sensor to at least one light radiation, also referred to as "illumination", of which the pixel Pi forms part, and to convert these photons into electron-hole pairs. The photosensitive region 12 is formed in a semiconductor substrate 10.

This substrate 10 can for example be based on silica and include a first region 13 made from semiconductor material doped with a first conductivity type, for example in accordance with a p-type doping. The first doped region 13 extends in particular in a lower portion as well as in an upper central portion 131 of this pixel Pi. The substrate 10 has for example, at the first doped region 13, a concentration of dopants of between $1^e14$ cm$^{-3}$ and $1^e17$ cm$^{-3}$ atoms/cm$^3$.

The photosensitive region 12 is for example intended to be illuminated from a back face 10B of the substrate 10. Although this is not shown in FIG. 1, the back face 10B of the substrate 10, opposite to its front face 10A, can be coated with one or more passivation layers. On the back face 10B of the substrate 10, the pixel Pi can furthermore include optical elements such as a filter and/or a microlens.

The pixel Pi is delimited and separated from adjoining pixels by a so-called "peripheral isolation" trench 16 formed around the photosensitive region 12. The isolation trench 16 can entirely surround the photosensitive region 12 so as to form a closed contour for completely electrically isolating the photosensitive region 12 of the pixel Pi with respect to the photosensitive regions of adjoining pixels. By way of example of a particular embodiment, it is possible to provide a trench 16 with a width (the dimension measured parallel to the plane [O; x; y] of an orthogonal reference frame [O; x; y; z]) of the order of 160 nm.

In a variant, it is also possible to provide a peripheral isolation trench 16 producing a partial contour typically in the form of a succession of portions entirely defining at least the successive two sides or three sides of a rectangular perimeter while a part of this perimeter, for example a part of a side or of an angle of the rectangle, is open and does not include an isolation trench.

The peripheral isolation trench 16 is in particular a capacitive isolation trench, typically provided with a structure of the type CDTI ("Capacitive Deep Trench Isolation") and extends vertically in the thickness (the dimension measured parallel to the z axis of the orthogonal reference frame [O; x; y; z] on FIG. 1) of the substrate 10. The trench 16 is in this case lined, at the bottom and on its side walls, with at least one insulating layer 161, for example of silicon oxide (SiO$_2$) and filled with a conductive material 162, for example highly doped polysilicon. The conductive material 162 is connected to a contact 164 to be biased at a potential VCDTI. By way of example, in the case where the substrate 10 is p type, the conductive region of the peripheral isolation trench 16 can be taken to a fixed potential VCDTI, for example of the order of 2.5 V.

In the particular example embodiment given on FIG. 1, the conductive material 162 of the CDTI structure is buried and extends over only a portion of the thickness of the substrate 10 between the front face 10A and the back face 10B. Thus the top part of the trench 16 is not filled by the conductive material 162, but includes here an insulating block 163, typically made from silicon oxide through which a contact 164 passes, typically metal, for example made from tungsten. An arrangement where the conductive material 162 extends completely through the thickness of the substrate 10 as far as the front face 10A can in a variant be provided.

The pixel Pi furthermore includes a vertical transfer gate TG formed in the semiconductor substrate 10. The vertical transfer gate TG is disposed inside the part of the substrate 10 delimited by the peripheral isolation trench 16.

The vertical transfer gate TG is formed in another isolation trench 18 arranged vertically in the thickness of the substrate 10. This other trench 18 typically extends between the top face 10A and a depth less than that of the peripheral isolation trench 16. The vertical transfer gate TG thus typically has a height less than that of the CDTI structure. By way of example of a particular embodiment, it is possible to provide a trench 18 with a width (the dimension measured parallel to the plane [O; x; y] of an orthogonal reference frame [O; x; y; z]) of the order of 180 nm. The other trench 18 is interrupted in the thickness of the substrate 10 and does not emerge at the bottom face 10B of the substrate 10.

The other trench 18 is in this case lined, at the bottom and on its side walls, with at least one dielectric layer 181, for example of silicon oxide (SiO$_2$) and is filled with a conductive material 182, for example highly doped polysilicon. The conductive material 182 is connected to a contact 184 to bias the transfer gate.

In the particular example embodiment given on FIG. 1, the conductive material 182 is buried. Thus the top part of the trench 18 is not filled by the conductive material 182, but includes here an insulating block 183, typically made from silicon oxide through which a contact 184 passes, typically metal, for example made from tungsten. An alternative arrangement where the conductive material 182 extends as far as the front face 10A can in a variant be provided.

Figure 2:
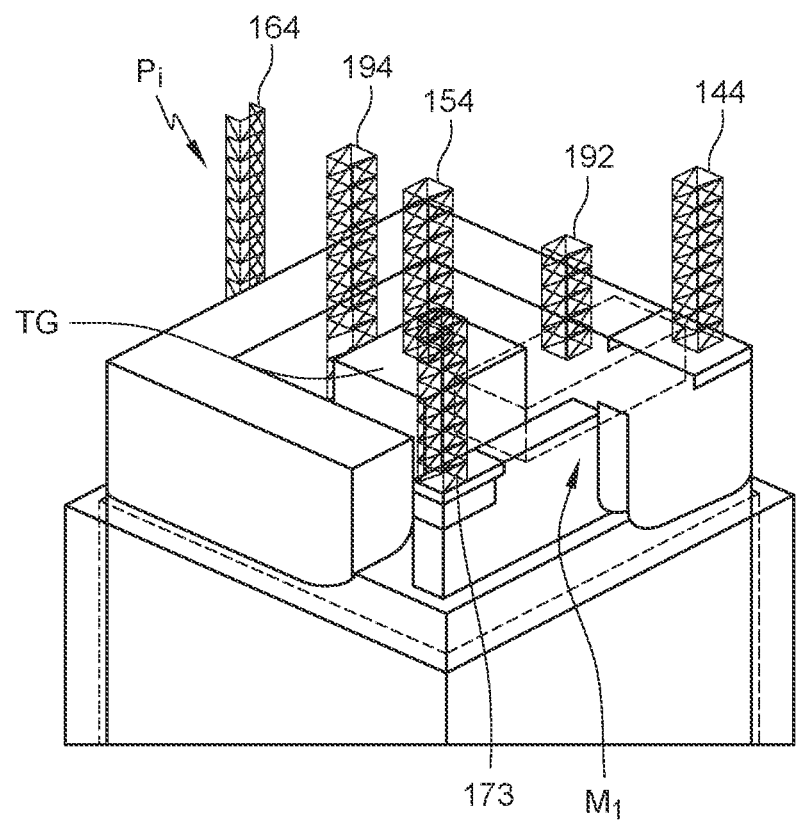
FIG. 2 is a schematic partial plan view of another arrangement of the image capture pixel associated with the transistor for accelerating detection of an overflow of charges.

In the example embodiment illustrated on FIG. 2 (giving a plan view of a particular arrangement of the pixel Pi), the other trench 18 produces a partial contour, in particular in the form of a "C" or "U" around a central upper portion of the substrate 10.

Figure 3:
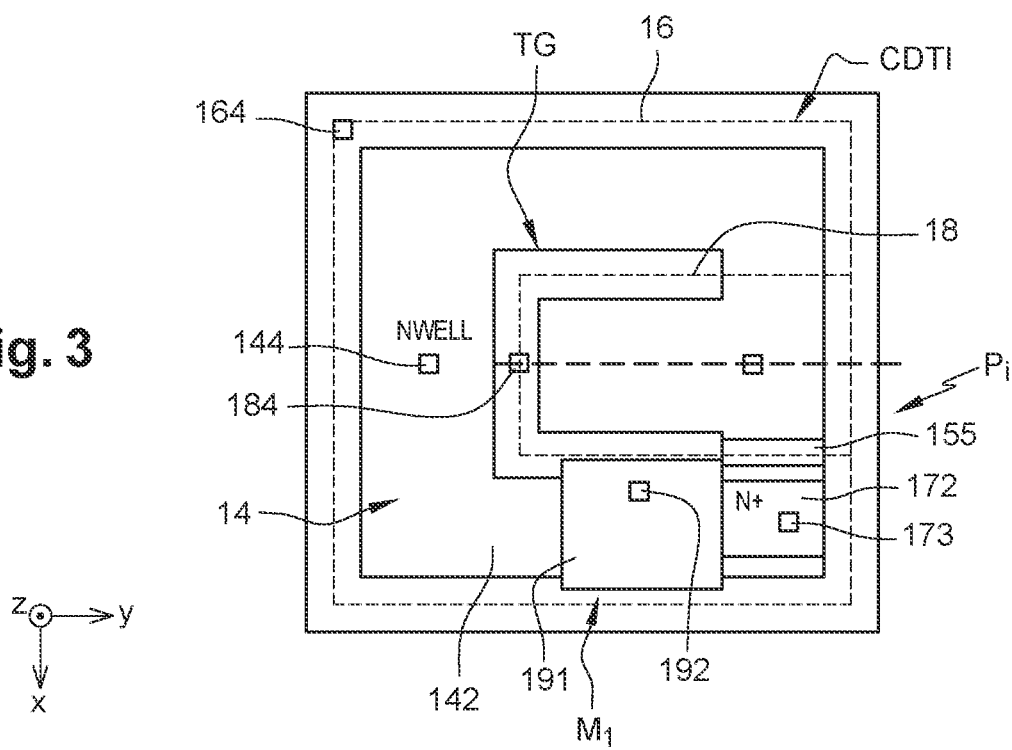
FIG. 3 is a schematic partial perspective view of another arrangement of the image capture pixel associated with the transistor for accelerating detection of an overflow of charges.

In a variant, and as illustrated in the example arrangement in FIG. 3 (giving a perspective view of another particular arrangement of the pixel Pi), the transfer gate TG entirely surrounds a central upper portion of the substrate on which a sense node SN is provided.

During an exposure of the pixel Pi, the transfer gate TG is biased so as to form a potential barrier between the photosensitive region 12 and a portion 131 bordered by this vertical transfer gate TG. By way of example, in the case where the substrate 10 is p type, the conductive region of the other trench 18 can be taken to a potential VTG, for example of the order of 1.5 V, to impose the potential barrier.

The presence of the potential barrier makes it possible, during an exposure phase, to block a transfer of photogenerated-holes from the photosensitive region 12 to a so-called "collecting" region 151. This potential barrier results from the presence, along side walls of the other isolation trench 18, of an inversion layer attracting the carriers of a type opposite to the substrate 10, i.e the electrons, when the portion 131 is doped according to the first conductivity type, here according to a p doping.

In a conventional reading phase subsequent to the exposure phase, the transfer gate TG is next taken to a distinct potential in order to reduce, or even eliminate, the potential barrier. The disappearance of the potential barrier allows, during the conventional reading phase, a transfer of photo-generated-holes from the photosensitive region 12 to the collecting region 151.

In the example shown on FIG. 1, a portion 131 of the doped region 13 according to the first conductivity type is located inside a space delimited by the vertical transfer gate TG, and in particular by the internal side walls of the vertical transfer gate TG.

Above this portion 131, there is the so-called "charge collecting" region 151, also doped according to the first conductivity type, and which serves to form a sense node SN. The sense node SN makes it possible for example to transfer charges accumulated in the region 151 to a reading circuit or a charge overflow detection stage.

The collecting region 151 extends in the thickness of the substrate 10, from its top face 10A, and is bordered by the other isolation trench 18. The collecting portion 131 is typically more highly doped, in this example p+, than the portion 131 situated below. The sense node SN is also formed by a conductive element 154, typically in the form of a metal pad situated on and in contact with the collecting region 151.

The pixel Pi also includes a well 14 interposed between the peripheral isolation trench 16 accommodating the CDTI structure and the other trench 18 in which the vertical transfer gate structure TG is formed. The well 14 extends in the thickness of the substrate 10 and in particular in the top part thereof, from the top face 10A of the latter.

The well 14 is doped and has a second conductivity type, opposite to the first conductivity type. In this example, the well 14 is thus n-doped when the region 13 is p-doped. The well 14 includes a first part 141 in which it extends laterally from the trench 16 in which the CDTI is produced as far as the other trench 18 in which the vertical transfer gate structure TG is formed.

In the example shown, a conductive pad 144 is located on and in contact with a doped region 143 of the second conductivity type, more highly doped than the rest of the well 14.

In this example, the region 143 may be n+ doped when the rest of the well 114 is n doped. The conductive pad 128 makes it possible for example to provide a potential $V_{NWELL}$ for the well 14.

With the pixel Pi, it is also possible to implement a distinct particular detection of a succession of conventional exposure and reading phases.

In this particular detection operation, referred to as "charge overflow detection", the transfer gate TG can be maintained at the same fixed potential. It is then detected, following an illumination of the pixel Pi, when the internal potential of a diode (i.e. the potential of the photosensitive region 12) exceeds that of a potential barrier implemented by the gate biasing TG, so that-photogenerated charges following this illumination, in particular holes, overflow from the photosensitive region 12 to the collecting region 151, despite the potential barrier applied to the transfer gate TG. The diode is here formed by the first region 13 doped with the first conductivity type, for example p doped, and a well 14 with the opposite doping and the second conductivity type, for example n doped.

A detection circuit provided for example with a comparator connected to the sense node SN can for this purpose be provided and configured to emit a signal indicating overflow following a variation in potential at the sense node due to an overflow of charges while the transfer gate is biased so as to maintain a potential barrier.

One means for adjusting the quantity of charges corresponding to the triggering or overflow threshold is to adjust the biasing potential VTG that is applied to the transfer gate TG.

Advantageously, the pixel here has the particularity of integrating a so-called "detection acceleration" transistor M1, making it possible to make more rapid a detection of the overflow of charges by the sense node SN mentioned previously. The transistor M1 can also make it possible, by runaway, to amplify the detection of an overflow of charges. It can therefore also make it possible to implement a detection with a reduced detection threshold.

This transistor M1 has a gate 191 arranged on the top face 10A of the substrate and which is connected to the sense node SN.

The transistor M1 is in this example an n-type transistor, in particular when the region 13 and the collecting region 151 of the sense node SN have a p-type doping and are intended to collect charges in the form of photogenerated holes.

The transistor M1 has a channel region formed in a doped part 135 of the substrate 10 having the first conductivity type, in particular p type.

Thus the well 14 can include a region 142 which, unlike the part 141, does not extend entirely laterally from the trench 16 (in which the CDTI structure is arranged) as far as the other trench 18 (in which the vertical transfer gate structure TG is formed). The well 14 doped according to the second conductivity type is thus interrupted in an upper region of the substrate 10 in which the doped region 13 according to the first conductivity type extends, a part 135 of this doped region 13 reaching the top face 10A of the substrate 10.

Advantageously, the source region of the $M_1$ transistor is formed in the region 142 of the well 14. In this case, the well 14 and the source region of the transistor M1 have identical biasing imposed by the bias of the conductive pad 144.

The transistor M1 includes a drain region formed in a doped region 172 having the second conductivity type. This region, for example of n+ type, is typically doped more highly than the region 142 of the well 14. In order to avoid a short-circuit, it is possible here to provide an insulating region 155, for example of the STI type, between the active region and the drain region 172 in this doped example.

To make it possible to isolate the transistor M1 from the CDTI structure, an isolation block 55, for example made from silicon oxide ($SiO_2$) can advantageously be provided between the transistor M1 and the trench 16. In the example embodiment illustrated on FIG. 1, this block 55 is located between the region 172 having the second conductivity type forming the drain region of the transistor M1 and the peripheral isolation trench 16.

During a charge overflow detection operation, the following biasing can be adopted:
 a fixed potential VCDTI is typically applied to the contact 164 to bias the CDTI structure, this potential VCDTI being able, according to a particular example embodiment, to be of the order of 2.5 V;

a fixed potential VTG is maintained on the contact 164 to bias the CDTI structure, this potential VTG being able, according to a particular example embodiment, to be of the order of 1.5 V;

According to a first phase, an initialisation potential Vinit_SN is applied to the sense node SN, for example of the order of 0 V, by means of the conductive element 154 and then according to a second phase of the overflow detection operation, the conductive element 154 is left floating or at high impedance;

according to a first phase, an initialisation potential of the well 14 Vinit_NWELL, for example of the order of 1.3 V, is applied to the conductive pad 144 for biasing the well and then according to a second overflow detection operation phase, the conductive pad 144 is left floating or at high impedance;

Following the detection of an overflow of charges by variation of the potential at the sense node SN, the initialisation potential Vinit_NWELL is once again applied to the well 14 and the initialisation potential Vinit_SN to the sense node. The pixel Pi is then ready for implementing a new charge overflow detection.

An operating mode of the pixel Pi integrating the transistor M1 during an overflow detection operation will now be described in relation to FIGS. 5 and 6.

Figure 4:
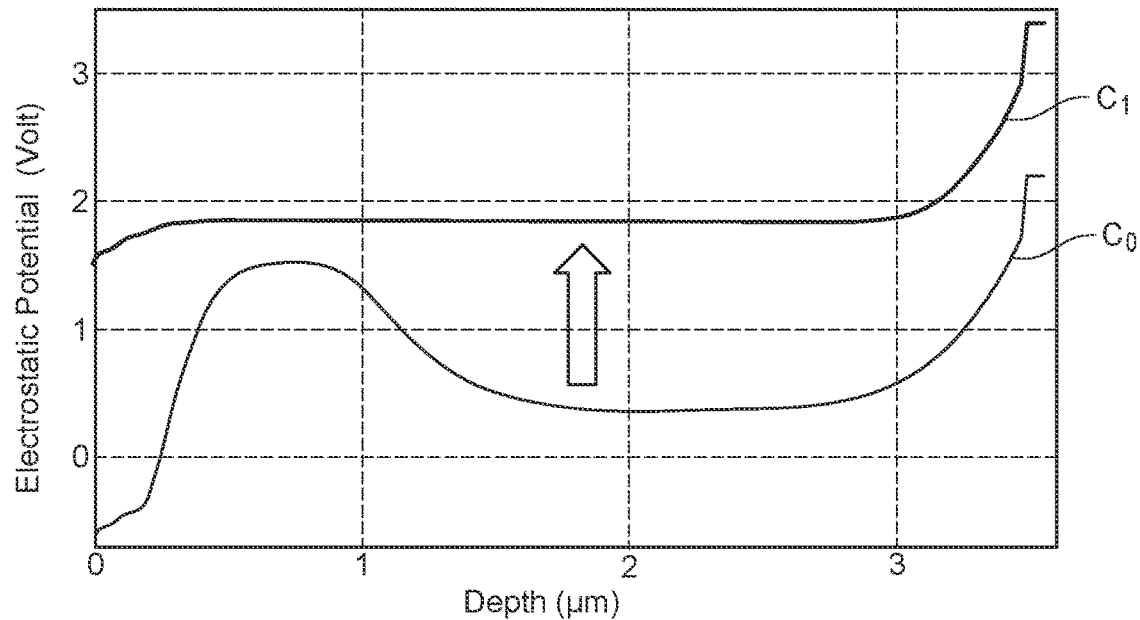
FIG. 4 gives curves for change of potential in a pixel before and after exposure thereof.

On FIG. 4, a possible change to the internal potential of the diode is given according to the depth in the substrate 10 before illumination (curve $C_0$) and after illumination (curve $C_1$).

Figure 5:
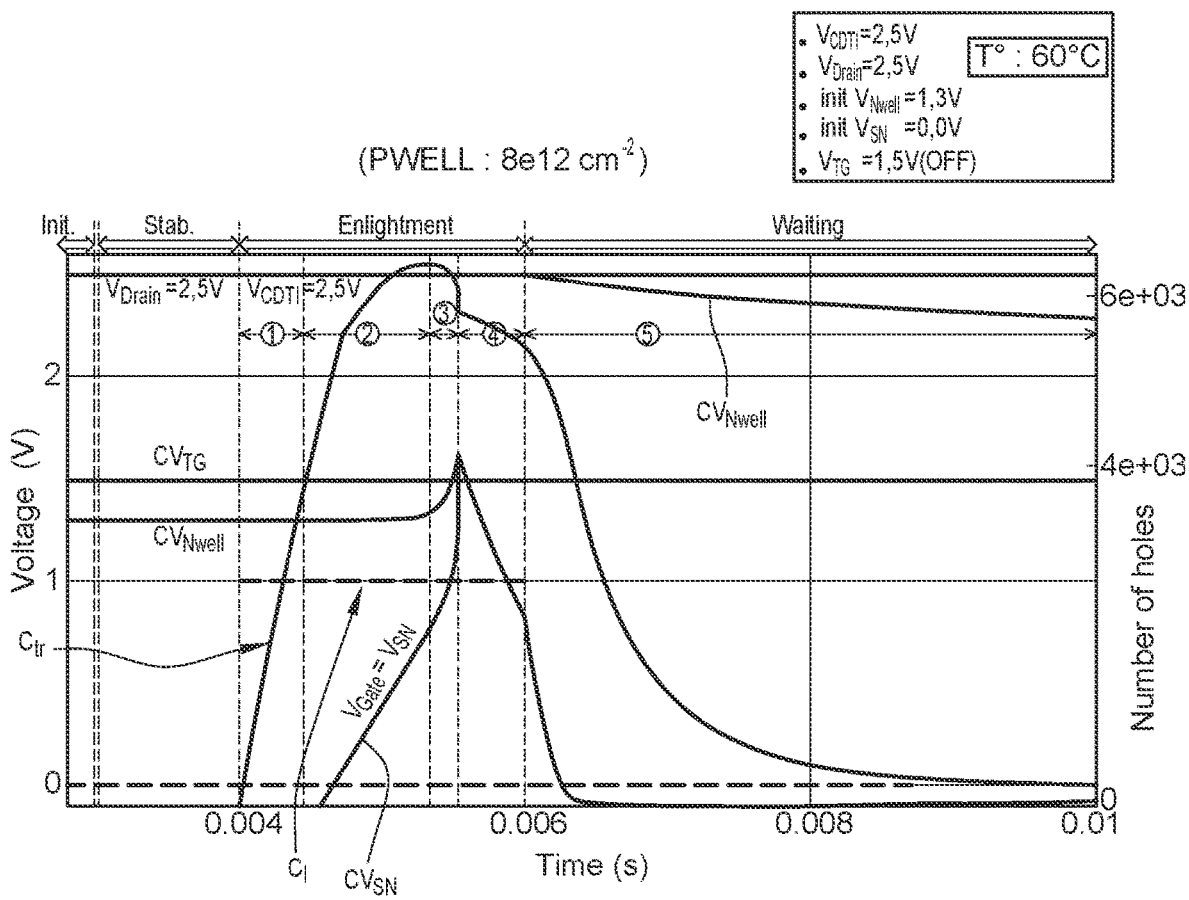
FIG. 5 gives curves for change of signals and potential in a pixel during an operation of detecting overflow of charges.

FIG. 5 gives curves resulting from an overflow detection operation simulation implemented by illumination by means of a radiation at a wavelength λ of the order of 450 nm at a temperature of the order of 60°.

Throughout the overflow detection operation, a fixed potential (curve CVTG) is maintained, for example of the order of 2.5 V on the gate TG.

When the pixel Pi is illuminated (curve $C_I$ in discontinuous lines), the region 13 fills with positive charges (curve Ctr increasing).

If the internal potential of the diode formed by the region 13 and the gate 14, which changes according to the quantity of photogenerated charges, becomes higher than the potential of the barrier imposed by the transfer gate TG and which constitutes an overflow threshold, charges overflow towards the collection region 151 of the sense node SN.

This causes a rise in potential (curve $CV_{SN}$ increasing) of the sense node SN, which is connected to the gate of the NMOS transistor M1. All The transistor M1 is then switched on.

When the channel of the transistor M1 begins to conduct, the potential of the well 14, here corresponding to the potential of the source region, joins the voltage Vdrain applied to the drain region. This voltage Vdrain is typically a voltage higher than that of the source region of the transistor M1. This participates in the weakening of the inversion layer, and favours the passage of the charges to the sense node SN. The potential barrier present between the portions of the gate TG is weakened.

The photosensitive region 12 empties, and it is possible to detect an overflow of charges simply by detecting a variation, in particular a rapid rise, in the potential on the sense node SN.

Figure 6:
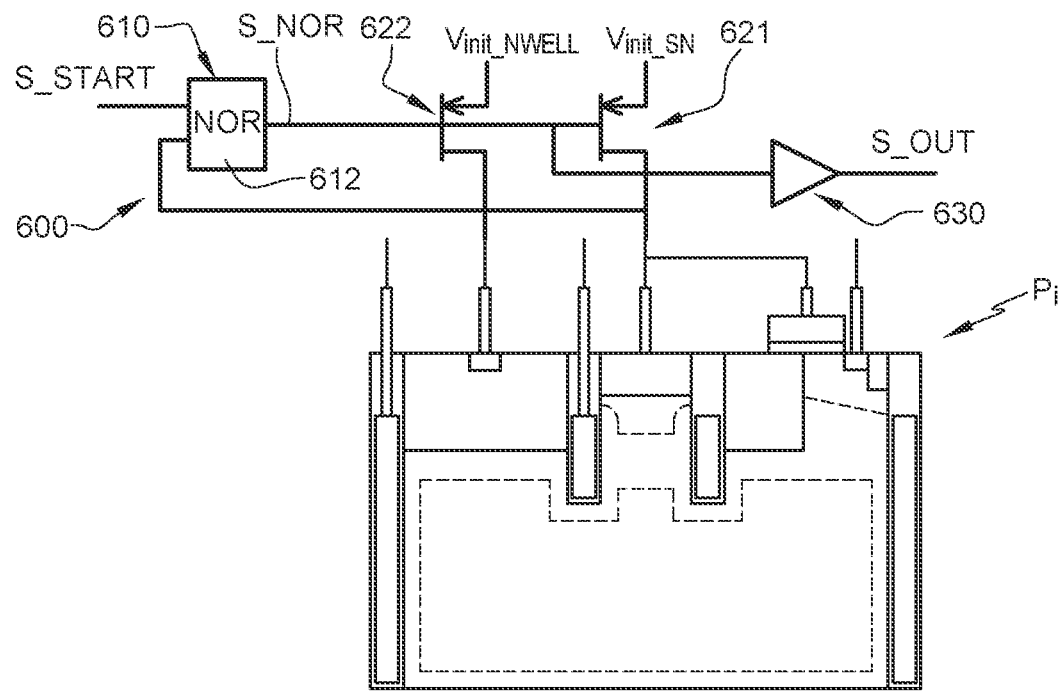
FIG. 6 serves to illustrate a circuit controlling biasing of the pixel during an operation of detecting overflow of charges, and an overflow detection stage.

For this purpose, the sense node SN can be connected, as in the particular example embodiment illustrated on FIG. 6, to a stage 630 provided with a comparator for generating a signal S_OUT indicating overflow. A logic gate performing a "YES" function or in a variant a logic gate performing a "NO" function can also be used for implementing this stage.

On this figure, the pixel Pi is associated with a control circuit 600, for applying various biasing signals to the pixel Pi during the overflow detection operation and for reinitialising the pixel Pi once an overflow detection operation is implemented in order to make it ready to implement a new overflow detection operation.

The control circuit 600 is provided with a first stage 610, in particular provided with a gate 612 implementing a "NOR" logic function, comprising a first input designed to receive a signal S_START triggering the start of an overflow detection operation.

A second input of the gate 612 is connected to the sense node SN itself connected to the gate of the transistor M1.

The control circuit 600 can furthermore be provided with a first coupling switch, here a first transistor 621, for example of the PMOS type. The first transistor 621, the gate of which is controlled by the output signal S_NOR of the first stage 610, is designed to, when it is switched on, couple the sense node SN to a first initialisation potential Vinit_SN and, when it is switched off, set the sense node to high impedance.

The control circuit 600 can furthermore be provided with a second coupling switch, in particular a second transistor 622, for example of the PMOS type. The gate of the transistor 622 is controlled by the output signal S_NOR. The transistor 622 is designed to, when it is switched on, couple the well 14 to an initialisation potential Vinit_NWELL and, when it is switched off, to set the well 14 to high impedance.

Figure 7:
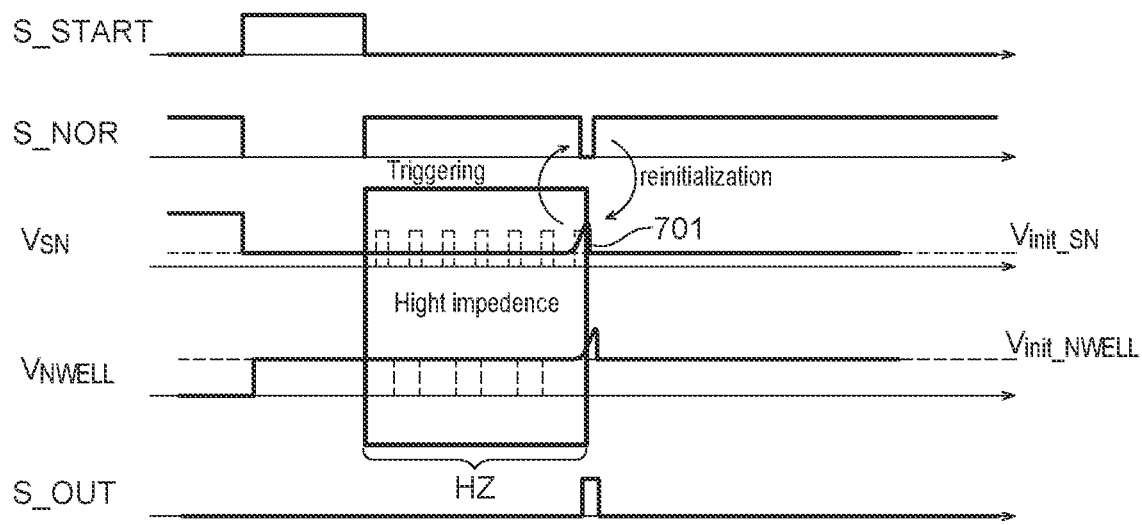
FIG. 7 is a timing diagram of various signals able to be used in the circuit controlling the pixel during an operation of detecting overflow of charges.

An example of a timing diagram of operation of such a circuit 600 is given on FIG. 7.

The overflow detection operation is initialised. This results in a change in state of the trigger signal S_START delivered at the input of the stage 610. This causes a change in state of the signal S_NOR produced by the gate 612 implementing the NOR function, said change of state switching on the transistors 621 and 622. The initialisation potentials Vinit_NWELL and Vinit_SN are then applied respectively to the well 14 and sense node SN.

Then, according to a subsequent operating phase caused by a change of state of the trigger signal S_START, the signal S_NOR is modified so as to deactivate the transistors 621 and 622. The well 14 and the sense node SN are then put in a state of high impedance HZ. An illumination causing an overflow of charges generates a variation of potential on the sense node SN that results for example in a potential peak 701 on FIG. 7. The stage 630 then delivers a signal (change in state of the overflow indicator signal S_OUT).

The sense node SN being connected to the input of the NOR gate 612, this variation (peak 701) causes a change in state of the signal S_NOR that once again switches on the transistors 621 and 622 and thus makes it possible to once again initialise the well 14 and the sense node SN respectively at the potential Vinit_NWELL and at the potential Vinit_SN. The pixel Pi is then ready for implementing a new charge overflow detection.

The overflow indicator signal S_OUT may be a logic signal.

According to an advantageous embodiment, it is possible to use this signal S_OUT to increment a counter and to count a number of overflows. Thus, in the particular example embodiment illustrated on FIG. 8, the indicator stage 630 is associated with a counter 810 configured to be incremented at each reception or change of state of the overflow indicator signal S_OUT. It is thus possible to implement a counting of events, each event corresponding here to an overflow detection. At the scale of the image, an observation of the various pixels that detects an overflow can be implemented.

Figure 8:
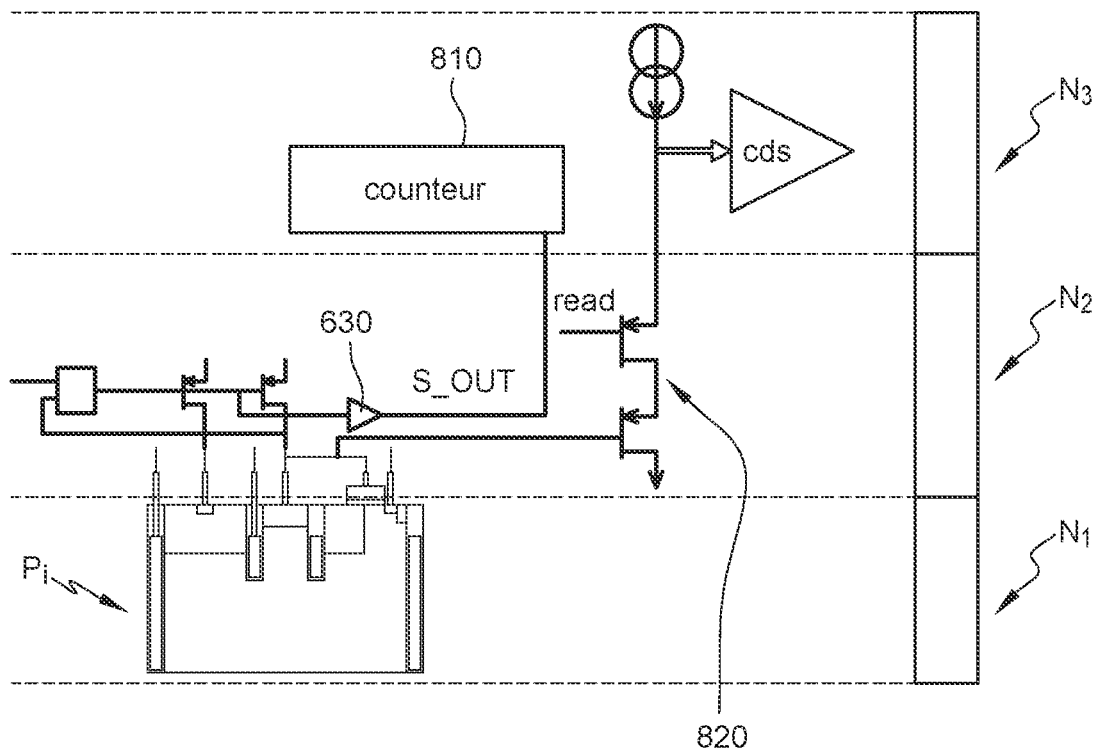
FIG. 8 serves to illustrate an example of a particular embodiment of the sensor on a plurality of superimposed levels of active components, the pixel and its control circuit being arranged on distinct levels.

In the particular example embodiment illustrated on FIG. 8, the pixel Pi is located in a first circuit level N1 of a device including a plurality of superimposed levels N1, N2, N3. The control circuit 600 making it possible to apply various biasing signals to the pixel Pi, and the overflow indicator stage 630, are here located in a second level N2 above the first level N1. A reading circuit 820 allowing a conventional reading of a quantity of charges coming from the sense node SN can also be arranged in the second level N2. In the example configuration illustrated, the counter 810 is here located on a third level N3 on which a correlated double sampling circuit CDS ("correlated double sampling") is located. The levels N1, N2, N3 of components or circuits can be superimposed and connected together by an assembly technique commonly called "hybridisation".

A charge overflow detection pixel as described previously can find many applications and be incorporated in a multiple automatic pixel reinitialization device as described in the document «Realization and opto-electronic Characterization of linear Self-Reset Pixel Cells for a high dynamic CMOS Image Sensor», by Hirsch et al., Adv. Radio Sci., 17, 239-247, 2019.

The rapid overflow detection pixel can also be incorporated in a device using edge-of-matrix counters, and in particular photon counters as used in some SPAD systems (SPAD standing for "Single-Photon Avalanche Diode") and in particular in a system as described for example in the document: «7.5 A 250 fps 124 dB Dynamic-Range SPAD Image Sensor Stacked with Pixel-Parallel Photon Counter Employing Sub-Frame Extrapolating Architecture for Motion Artifact Suppression», J. Ogi, et al., 2021, IEEE International Solid-State Circuits Conference (ISSCC).

The rapid overflow detection pixel can also be integrated in an event detection imaging device of the type such as the one described for example in the document «5.10 A 1280× 720 Back-Illuminated Stacked Temporal Contrast Event-Based Vision Sensor with 4.86 µm Pixels, 1.066GEPS Readout, Programmable Event-Rate Controller and Compressive Data-Formatting Pipeline», by Thomas Finateu et al., 2020 IEEE International Solid-State Circuits Conference—(ISSCC) or in the document: «A 1280×960 Dynamic Vision Sensor with a 4.95-µm Pixel Pitch and Motion Artifact Minimization», by Yunjae Suh et al., IEEE International Symposium on Circuits and Systems (ISCAS), 2020, or in the document: «Development of Event-based Sensor and Applications», Shoushun Chen, OmniVision, 2020.

In the case where a very rapid overflow detection is implemented and the quantity of charges detected is limited, provision can be made for integrating a rapid charge overflow detection pixel as described previously in an imager configured to make distance measurements on a scene, using the time elapsed between the emission of light radiation by an emitting source and the instant when the pixel overflow is detected following the reception of this radiation by the imager.

Such a device can then furthermore be provided with a so-called TDC ("Time to Digital Counter") counter for the temporal estimation of the arrival of photons.

The invention claimed is:

1. An image sensor comprising one or more pixels, each pixel including:
a photosensitive region formed in a semiconductor substrate;
a peripheral isolation trench extending vertically in the semiconductor substrate and laterally delimiting the photosensitive region;
a sense node including a region for collecting photogenerated charges arranged at a top face of the substrate, the charge-collecting region being doped and having a first p conductivity type;
a charge-transfer gate extending vertically in the semiconductor substrate around the charge-collecting region; and
a well interposed between the peripheral isolation trench and the charge-transfer gate, and arranged around the sense node, the well being doped and having a second n conductivity type, opposite to the first conductivity type, the photosensitive region being formed by a first doped region that is of the first p conductivity type, and which extends under the charge-collecting region and under the well and forms a diode with the well,
the sensor being provided with at least one pixel integrating a detection acceleration transistor, the detection acceleration transistor having a gate arranged on said top face of the substrate and which is connected to the sense node, the detection acceleration transistor being configured to, during a charge overflow detection operation during which a biasing of the charge-transfer gate is applied so as to form a potential barrier then maintained and following an illumination of the photosensitive region during said operation causing a transfer of photogenerated charges from the photosensitive region to the sense node and a variation in potential at this sense node, be switched on, the switched-on detection acceleration transistor weakening the potential barrier and favoring a transfer of photogenerated charges to the sense node of the photosensitive region, the detection acceleration transistor including a channel region formed in a doped part of the substrate having the first conductivity type and belonging to said first region.

2. The image sensor according to claim 1, wherein said channel region of the detection acceleration transistor extends at a top face of the semiconductor substrate between a region of said well, forming a source region of said detection acceleration transistor, and another region having the second conductivity type, and forming a drain region of said detection acceleration transistor.

3. The image sensor according to claim 2, wherein said other region has the second conductivity type and has a doping of n+ type, greater than the doping of said region of said well.

4. The image sensor according to claim 2, wherein an isolation block is arranged between the peripheral isolation trench and said other region having the second conductivity type.

5. The image sensor according to claim 1, comprising a control circuit configured to apply, during said operation of detecting overflow of charges, a potential to the charge-transfer gate so as to maintain said potential barrier during said operation of detecting overflow of charges.

6. The image sensor according to claim 5, wherein the control circuit is configured to, during said operation of detecting overflow of charges:
in a first phase, apply, to the gate of said detection acceleration transistor, a first initialisation potential so as to keep the transistor switched off, then
in a second phase, put the sense node and the gate of the detection acceleration transistor in high impedance.

7. The image sensor according to claim 6, wherein the control circuit is configured to,
   in said first phase: apply, to a source region of the detection acceleration transistor, a second initialisation potential lower than a given potential applied to a drain region of the detection acceleration transistor, then
   in said second phase: put a region of said well at high impedance while maintaining said given potential on said drain region.

8. The image sensor according to claim 6, wherein the control circuit is configured to, following said variation in potential on the sense node, reset the sense node to the first initialisation potential and said region of said well to the second initialisation potential.

9. The image sensor according to claim 5, wherein the control circuit is provided with:
   a first stage provided with at least one gate implementing a NOR logic function, comprising a first input designed to receive a signal triggering the start of a detection operation and a second input coupled to the sense node and to the detection acceleration transistor gate,
   a first coupling switch controlled by the output signal of the first stage and which is designed to, when it is switched on, couple the sense node to a first initialisation potential and, when it is switched off, set the sense node to high impedance, and
   a second coupling switch controlled by an output signal of the first stage and which is designed to, when it is switched on, couple the well to a second initialisation potential and, when it is switched off, to set the well to high impedance.

10. The image sensor according to claim 5, wherein the transistor belongs to a circuit indicating charge overflow formed by an indicator stage, provided with a comparator or with a logic gate, such as a logic gate fulfilling a YES function or a NO function, configured to produce, following said variation in potential on the sense node, a signal indicating said overflow.

11. The image sensor according to claim 10, wherein the overflow indicator circuit is associated with a counter configured to be incremented at each reception of said overflow indicator signal.

12. The image sensor according to claim 5, wherein the pixels are arranged in a given level of a device including a plurality of superimposed levels of components and wherein the control circuit is arranged in another level of the device, distinct from said given level, said given level and said other level being superimposed.

13. A time-of-flight image capture device comprising the image sensor according to claim 1.

14. An image capture device based on the detection of events, comprising the image sensor according to claim 1.

* * * * *